US011049009B2

(12) United States Patent
Shulkin et al.

(10) Patent No.: US 11,049,009 B2
(45) Date of Patent: Jun. 29, 2021

(54) IDENTIFYING MEMORY BLOCK WRITE ENDURANCE USING MACHINE LEARNING

(71) Applicant: Western Digital Technologies, Inc., Irvine, CA (US)

(72) Inventors: Arthur Shulkin, Yavne (IL); Alexander Kalmanovich, Jerusalem (IL); Ariel Navon, Revava (IL); David Rozman, Kiryat-Malakhi (IL)

(73) Assignee: Western Digital Technologies, Inc., San Jose, CA (US)

(*) Notice: Subject to any disclaimer, the term of this patent is extended or adjusted under 35 U.S.C. 154(b) by 1017 days.

(21) Appl. No.: 15/640,225

(22) Filed: Jun. 30, 2017

(65) Prior Publication Data
US 2018/0357535 A1    Dec. 13, 2018

Related U.S. Application Data

(60) Provisional application No. 62/518,398, filed on Jun. 12, 2017.

(51) Int. Cl.
*G06N 3/08* (2006.01)
*G06F 3/06* (2006.01)
(Continued)

(52) U.S. Cl.
CPC ............. *G06N 3/08* (2013.01); *G06F 3/0616* (2013.01); *G06F 3/0653* (2013.01);
(Continued)

(58) Field of Classification Search
CPC ....... G06F 3/0616; G06F 3/0679; G06N 3/08; G06N 20/00
See application file for complete search history.

(56) References Cited

U.S. PATENT DOCUMENTS 7,925,936 B1  4/2011  Sommer
8,140,746 B2  3/2012  Trichina et al.
(Continued)

FOREIGN PATENT DOCUMENTS

CN    102227121 B    10/2013

OTHER PUBLICATIONS

Arbuckle et al., Optimising Flash Non-volatile Memory Using Machine Learning: A Project Overview, Conference: Proceedings of the Fifth Balkan Conference in Informatics (BCI'12), Sep. 2012.
(Continued)

*Primary Examiner* — Benjamin P Geib
(74) *Attorney, Agent, or Firm* — Barry IP Law, P.C.

(57) ABSTRACT

Systems and methods are described for predicting an endurance of groups of memory cells within a memory device, based on current characteristics of the cells. The endurance may be predicted by processing historical information regarding operation of memory devices according to a machine learning algorithm, such as a neural network algorithm, to generate correlation information between characteristics of groups of memory calls at a first time and an endurance metric at a second time. The correlation information can be applied to current characteristics of a group of memory cells to predict a future endurance of that group. Operating parameters of a memory device may be modified at a per-block level based on predicted block endurances to increase the speed of a device, the longevity of a device, or both.

24 Claims, 6 Drawing Sheets

(51) Int. Cl.
*G06N 3/04* (2006.01)
*G11C 11/56* (2006.01)
*G11C 16/34* (2006.01)
*G11C 16/10* (2006.01)
*G11C 16/28* (2006.01)
*G06F 11/00* (2006.01)
*G11C 16/04* (2006.01)

(52) U.S. Cl.
CPC .......... *G06F 3/0679* (2013.01); *G06F 11/008* (2013.01); *G06N 3/04* (2013.01); *G11C 11/5628* (2013.01); *G11C 11/5642* (2013.01); *G11C 16/10* (2013.01); *G11C 16/28* (2013.01); *G11C 16/3495* (2013.01); *G11C 16/0483* (2013.01)

(56) References Cited

U.S. PATENT DOCUMENTS

| | | | |
|---|---|---|---|
| 8,984,210 | B2 | 3/2015 | Ryan et al. |
| 9,047,090 | B2 | 6/2015 | Kottilingal et al. |
| 9,262,319 | B2 | 2/2016 | Ryan et al. |
| 9,298,608 | B2 | 3/2016 | Fitzpatrick et al. |
| 9,417,803 | B2 | 8/2016 | Sandel et al. |
| 9,514,414 | B1 | 12/2016 | Rosswog et al. |
| 9,569,120 | B2 | 2/2017 | Ryan et al. |
| 10,013,211 | B2 * | 7/2018 | Lee ........................ G06F 3/0679 |
| 10,323,029 | B2 * | 6/2019 | Roberts ................ C07D 417/14 |
| 2011/0055461 | A1 | 3/2011 | Steiner et al. |
| 2012/0124273 | A1 | 5/2012 | Goss et al. |
| 2013/0191579 | A1 | 7/2013 | Sharon et al. |
| 2014/0003152 | A1 | 1/2014 | Sharon |
| 2014/0157086 | A1 | 6/2014 | Sharon et al. |
| 2014/0355347 | A1 | 12/2014 | Shur et al. |
| 2015/0058536 | A1 | 2/2015 | Seol et al. |
| 2015/0085573 | A1 | 3/2015 | Sharon et al. |
| 2015/0186072 | A1 | 7/2015 | Darragh et al. |
| 2015/0205657 | A1 | 7/2015 | Clark |
| 2015/0324148 | A1 | 11/2015 | Achtenberg et al. |
| 2016/0034206 | A1 | 2/2016 | Ryan et al. |
| 2016/0180951 | A1 | 6/2016 | Darragh et al. |
| 2017/0062069 | A1 * | 3/2017 | Yang .................. G11C 16/3445 |
| 2017/0075611 | A1 | 3/2017 | Stephen |
| 2019/0258423 | A1 | 8/2019 | Rozman et al. |

OTHER PUBLICATIONS

Arbuckle et al., Learning Predictors for Flash Memory Endurance: A Comparative Study of Alternative Classification Methods, International Journal of Computational Intelligence Studies 3.1, 2014, pp. 18-39.

Cai et al., Threshold Voltage Distribution in MLC NAND Flash Memory: Characterization, Analysis, and Modeling, DSSC, Department of Electrical and Computer Engineering, Carnegie Mellon University, 2013, 6 Pages, Pittsburgh, PA.

Hogan et al., Evolving a storage block endurance classifier for Flash memory: A trial implementation, Cybernetic Intelligent Systems (CIS), 2012 IEEE 11th International Conference on. IEEE.

Nakamura, et al., Machine Learning-Based Proactive Data Retention Error Screening in 1Xnm TLC NAND Flash, Reliability Physics Symposium (IRPS), 2016 IEEE International.

Arbuckle et al., "Learning Predictors for Flash Memory Endurance: A Comparative Study of Alternative Classification Methods," International Journal of Computational Intelligence Studies, vol. 3, No. 1, Jan. 1, 2014, p. 18-39.

Hogan et al., "Estimating MLC Nand Flash Endurance," Genetic and Evolutionary Computation, ACM, Jul. 6, 2013, pp. 1285-1292.

Ojha et al., Metaheuristic Design of Feedforward Neural Networks: A Review of Two Decades of Research, Engineering Applications of Artificial Intelligence, Pineridge Press, Swansea, GB, vol. 60, Feb. 10, 2017, pp. 97-116.

International Search Report and Written Opinion dated Jun. 13, 2018 in International Application No. PCT/US2018/022475.

* cited by examiner

IDENTIFYING MEMORY BLOCK WRITE ENDURANCE USING MACHINE LEARNING

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more read voltages. However, the sensed programming states can sometimes vary from the written programmed states due to various factors, resulting in a "failed bit." One factor that contributes to the likelihood of failed bits is the age of the memory cell, in terms of time of operation, number of prior writes to the cell, or both. Generally, older cells are more likely to experiences failed bits than younger cells. While flash memory devices often include error correction mechanisms to enable continued operation after the occurrence of a failed bit, too many failed bits can cause a device to cease functioning.

Due to variances in manufacturing of memory cells, the frequency of failed bits generally varies between individual cells (or groupings of cells, such as data blocks). For example, after a given amount of use (e.g., in terms of operating time, number of writes, or both) one memory cell within a device may experience significantly fewer failed bits than another memory cell within the device, even under the same usage conditions.

BRIEF DESCRIPTION OF THE DRAWINGS

Systems and methods that embody the various features of the invention will now be described with reference to the following drawings, in which.

DETAILED DESCRIPTION

Figure 1:
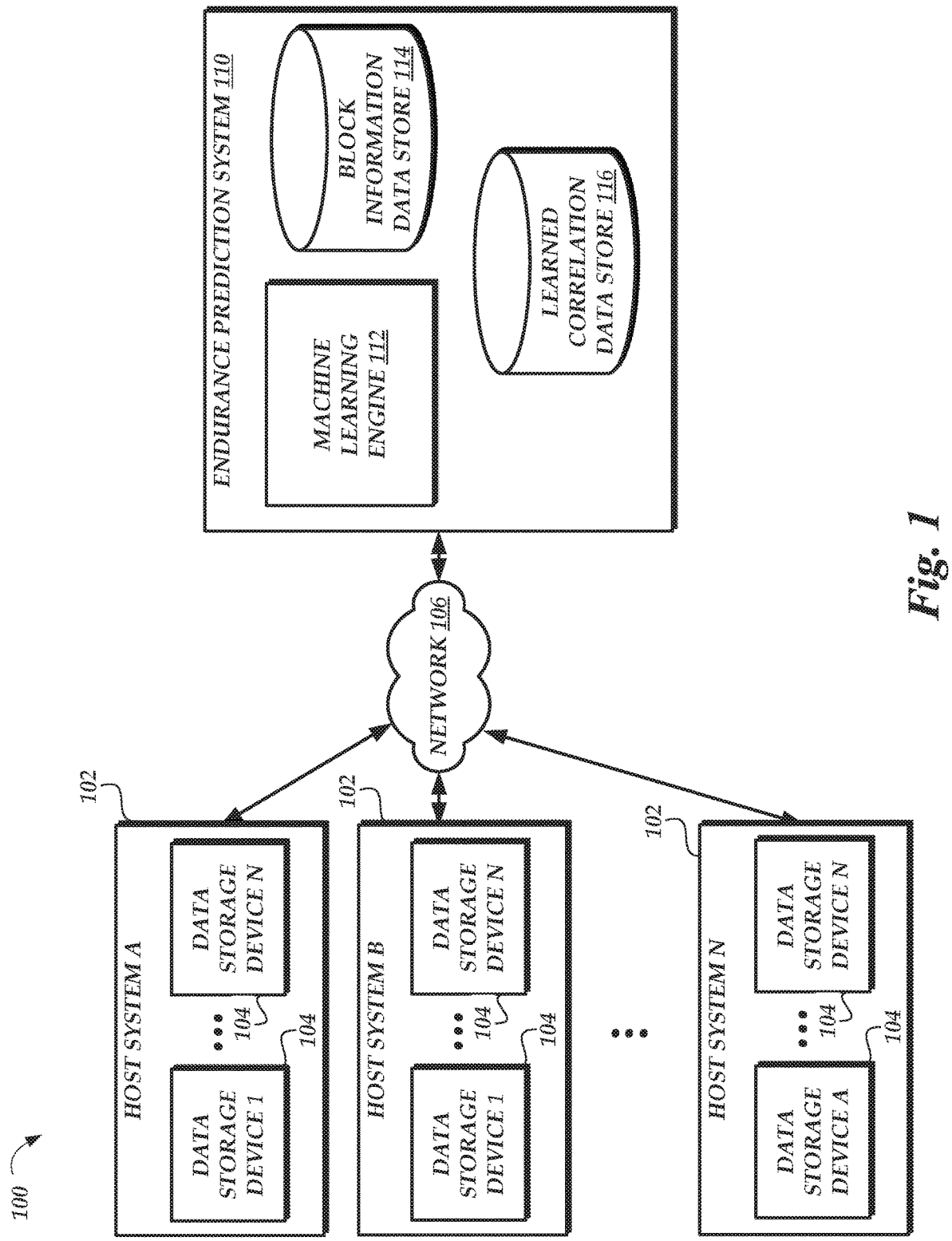
FIG. 1 is a block diagram illustrating an endurance prediction system according to some embodiments of the present disclosure, which applies a neural network machine learning algorithm to data regarding operation of data storage devices to facilitate prediction of an endurance of blocks within a storage device according to characteristics of the blocks.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Generally, some embodiments of systems and methods described herein improve the performance or endurance of a flash memory device by modifying operation of the device based on a predicted endurance of memory cells or groups of memory cells (e.g., data blocks) within the device. The predicted endurance of cells may be based on present characteristics of the cells, and reflect a predicted rate of failed bits when reading from the cells. To enable prediction of endurance based on present characteristics, historical data regarding operation of memory devices may be processed via a machine learning algorithm, such as a neural network algorithm, to determine a correlation between present characteristics of cells and future occurrence of failed bits within the cells. Thereafter, the determined correlation can be applied to present characteristics of cells within a given device to result in a predicted endurance of individual cells. Embodiments according to the present disclosure may thereafter modify operation of the memory device according to the predicted endurances of individual cells (or cell groups) in order to improve the performance of the device (e.g., a speed at which information can be written to or read from the device), the life span of the device (e.g., a total operating time or a total amount of data that may be written to or read from the device prior to uncorrectable errors occurring on the device), or both.

In one embodiment, an endurance prediction system is disclosed that can gather data regarding characteristics of individual data blocks (groupings of memory cells) within multiple flash memory devices at at least two points in time, such as shortly after manufacture of the device (e.g., before substantial use) and at or after the device reaches an endof-life. End-of-life may be defined according to any number of factors, which may include (by way of non limiting example) an operating time of the device, a number of read commands issued to the device, a number of write commands issued to the device, or an occurrence of uncorrectable errors on the device (e.g., measured as an absolute number or a frequency over time). The data collected at both points in time may reflect the same characteristics or different characteristics. In one embodiment, the data collected at a first point in time includes, for individual data blocks within a device, one or more of a number of detected failed bits having occurred at the block, a time required to program the block, a time required to erase the block, a number of programming loops required to program the block, and optimal read threshold voltages measured at the block. Each such data type is described in more detail below. However, generally, the data collected at a first point in time may reflect measurable, current characteristics of a data block due to a current physical state of the data block (as opposed, for example, to variable parameters that may be arbitrarily set for the data block). The data collected at a second or final point in time may reflect a measure of endurance of the block, such as a total number of failed bits experienced at the block over an operating life. This data may reflect an ability of the block to continue to have data written to and read from the block, and thus be indicative of a life span of the block. Other data may also be indicative of a life span of the block. For example, in some configurations a programing time of a block generally decreases over time (e.g., due to electron leakage). As such, the data collected at the second or final point in time may include a programming time of the block at an end-of-life. In one embodiment, a change in optimal read threshold voltages measured at the block may be indicative of endurance, and as such, the data collected at the second or final point in time may include optimal read threshold voltages for a block as measured at end-of-life of the device. Further details regarding use of a change in optimal read threshold voltages to measure an endurance of a block are described in U.S. Patent Publication No. 2016/0180951, entitled "Measuring Memory Wear and Data Retention Individually Based on Cell Voltage Distribution," published Jun. 23, 2016 (the "'951 publication"), the entirety of which is incorporate by reference herein.

After collecting the data discussed above (e.g., measurable data reflecting physical characteristics of a device at a first point in time and data reflecting endurance of a device at a second point in time), the endurance prediction system may process the data according to a machine learning algorithm, such as a neural network. Various examples of machine learning algorithms, including examples of neural networks, are generally known within the art. In brief, such an algorithm may be utilized to determine, from a data set, correlations between an input data vector and a set of potential outputs. In accordance with embodiments of the present disclosure, the endurance prediction system may utilize a machine learning algorithm, such as a neural network algorithm, to determine correlations between the physical characteristics of a device at a first point in time and the endurance of a device at a second point in time.

Illustratively, the endurance prediction system may pass into a neural network algorithm an input data vector regarding each of a number of blocks (e.g., as gathered across a number of flash memory devices) at a first point in time (e.g., shortly after manufacture of a respective device). The input data vector can include, for example, a failed bit count of the block at a first point in time, a programming time of the block, an erasure time of the block, a number of loops needed to program the block, and measured optimal read voltage thresholds for the block. These input data vectors may constitute an "input layer" to the neural network.

The endurance prediction system may further pass into the neural network algorithm data regarding a measured endurance of each block at a second point in time (e.g., at end of life of a device containing the block). The data regarding a measured endurance can include, for example, a total failed bit count occurrence at the block during operational life. In some instances, the data regarding a measured endurance may be a normalized or categorized (e.g., as falling within one of n potential ranges indicating progressive levels of endurance). This data may form the "output layer" to the neural network.

After providing the input and output layers, the endurance prediction system may implement the neural network algorithm to determine correlations between data points of the input layer (e.g., individual characteristics) and data points of the output layer (e.g., an endurance metric or categorization). These correlations may be represented, for example, by an equation that, for a given input data vector, provides a "score" for each possible value of an output layer (e.g., each endurance metric or categorization). In some instances, the equation may be a weighted linear combination of each data point within the input data vector, and the neural network algorithm may function to determine weights to be applied to each data point during a linear combination. In other instances, the equation may include non-linear relationships between one or more data points of the input data vector.

Once correlations between data points of the input and output layers have been determined, the endurance prediction system may utilize the correlations to predict an endurance of individual blocks within a flash memory device, and to modify operation of the flash memory device according to the predicted endurance. Additionally or alternatively, the endurance prediction system may provide the determined correlations to another device (e.g., a host computing device or the flash memory device itself) to enable that device to modify operation of the flash memory device according to the predicted endurance.

In one embodiment, modifying operation of the flash memory device may include causing the flash memory device to write to blocks with a frequency proportional to the block's predicted endurance, such that blocks with high predicted endurance are written to more frequently than blocks with lower predicted endurance. Because the practical lifespan of a flash memory device is often measured based on a frequency of uncorrectable errors occurring on the flash memory device as a whole, writing more frequently to blocks with higher predicted endurance can improve the overall lifespan of the device.

In another embodiment, modifying operation of the flash memory device may include modifying operation parameters to increase the speed of the device, at the expense of causing additional wear to blocks with a higher predicted endurance. Such modification of operation parameters can include, for example, utilizing more aggressive voltages when writing data to the blocks. These higher voltages may cause data to be written more quickly to the blocks, but result in an increased bit error rate on the blocks and thus a more rapid loss of endurance. Another example of a modification of operation parameters may be causing more aggressive garbage collection within the flash memory device, such that unneeded data written to the flash memory device is removed more frequently in blocks with higher predicted endurance, or such that data is relocated or regrouped among data blocks with higher predicted endurance to allow for reading of the data or faster writing of unused blocks created by such relocation. More frequent garbage collection can improve write speeds to a block (e.g., since unneeded the block need not be erased prior to writing), but increase wear on the block by increasing a number of erase operations that occur at the block. Various other modifications to increase a speed of operation of a flash memory device at the expense of increased wear are described within the '951 publication, incorporated by reference above.

While embodiments are discussed above that utilize data gathered at two points in time (e.g., just after manufacture and at end-of-life), other embodiments of the present disclosure may utilize data gathered at any number of points in time. The data from each point in time may be allocated to either representing data points for the input layer of a neural network algorithm or the output layer of a neural network algorithm, and the algorithm may be used to determine correlations between the points in time, as discussed above. For example, where data is gathered during every month of operation, a neural network algorithm may be used to correlate measured physical characteristics at a first month to endurance at each subsequent month, to correlate measured physical characteristics over a first six months to a next six months, to correlate measured physical characteristics over a first year to endurance at three years of operation, etc. Points in time may be defined by absolute time (e.g., hours, days, months, etc. of operation) or by other aspects of operation (e.g., amounts of data written to the drive). Thus, for example, embodiments as disclosed herein may be utilized to determine correlations between measured characteristics after a flash memory device has written one gigabyte of data and endurance metrics after the device has written one terabyte of data.

In some instances, the data discussed above may be gathered outside of a production environment. For example, a manufacturer of flash memory devices may gather data regarding operation of a set of test devices in order to gather data for use in a machine learning algorithm. Illustratively, the manufacturer may simulate operation of devices in a production environment, in order to gather data regarding characteristics of a device at a first point in time and endurance metrics at an end of life of the device. Such simulation may include, for example, performing a set of program-erase cycles on the device, each such cycle including writing data to the device and erasing the data. Thereafter, correlations learned based on application of the machine learning algorithm can be used to modify operation of devices prior to distribution of the devices for use in a production environment.

In other instances, the data discussed above may be gathered during use of flash memory devices in a production environment. For example, software on a host computing device (e.g., a device driver) may monitor operation of a flash memory device, and submit that information to the endurance prediction system disclosed herein for use in implementing a machine learning algorithm. Furthermore, the endurance prediction system may communicate learned correlations—or operating parameters established based on those learned correlations—to a host computing device, to modify operation of a flash memory device during production use based on current characteristics of blocks of the flash memory device. Thus, the endurance prediction system may iteratively implement the functionality disclosed herein, such that as more flash memory devices are monitored, the system can more accurately predict endurance of individual data blocks based on characteristics of the blocks.

The above will be more fully appreciated and understood with reference to the following description.

System Overview

FIG. 1 is a block diagram depicting an illustrative logical network environment 100 including multiple host systems 102 (labeled host systems A through N in FIG. 1) hosting data storage devices 104, which host systems 102 are in communication with an endurance prediction system 110 via a network 106.

In one embodiment, the network environment 100 is operated by or under control of a data storage device manufacturer. For example, the host systems 102 and the endurance prediction system 110 may be located within a data center (or multiple data centers) operated by the data storage device manufacturer. In another embodiment, the network environment 100 includes third party components. For example, one or more host systems 102 may be operated by end users as client computing devices, and the network 106 may include a publically accessible communication network.

The network 106 may be any wired network, wireless network, or combination thereof. In addition, the network 106 may be a personal area network, local area network, wide area network, global area network (such as the Internet), cable network, satellite network, cellular telephone network, or combination thereof. Protocols and components for communicating via the other aforementioned types of communication networks are well known to those skilled in the art of computer communications and thus, need not be described in more detail herein. While each of the host systems 102 and the endurance prediction system 110 is depicted as having a single connection to the network 106, individual components of the host systems 102 and the endurance prediction system 110 may be connected to the network 106 at disparate points. Accordingly, communication times and capabilities may vary between the components of FIG. 1. While the host systems 102 and the endurance prediction system 110 are shown in FIG. 1 as communicating via a network 106, in some embodiments these components may communicate via alternative communication channels. For example, a host system 102 may store data to a computer-readable medium (e.g., a hard disk drive or optical disc), which medium may be physically transported to the endurance prediction system 110 in order to enable communications between the two systems.

Host systems 102 may include any number of different computing devices capable of hosting a data storage device 104. For example, individual host systems 102 may correspond to a laptop or tablet computer, personal computer, wearable computer, server, personal digital assistant (PDA), hybrid PDA/mobile phone, mobile phone, electronic book reader, set-top box, camera, digital media player, and the like. In one embodiment, a host system 102 is a special-purpose computing device constructed by a manufacturer of a data storage device 104 to facilitate analysis of the data storage device 104 (e.g., during a quality assurance process).

Each host system 102 may host one or more data storage devices 104 (labeled in FIG. 1 as data storage devices 1 through n for each host system 102). In accordance with embodiments of the present disclosure, the data storage devices 104 can correspond to flash memory, including a set of NAND (negated and) memory cells that store electronic charge in order to store information of the host system 102.

Various examples of flash memory include solid state disk (SSD) drives and flash memory cards, such as compactFlash (CF), the MultiMediaCard (MMC), Secure Digital (SD), miniSD, Memory Stick, SmartMedia, TransFlash, and microSD cards. The data storage devices 104 may be embedded within the host system 102 (e.g., internal to a casing of the host system 102) or removably connected to the host system 102. While host systems 102 are illustratively shown in FIG. 1 as including multiple data storage devices 104, a host system 102 may in some instances include only a single data storage device 104. One potential configuration of a host system 102 and a storage device 104 is described with respect to FIG. 2, below.

In accordance with embodiments of the present disclosure, the endurance prediction system 110 may include elements or components enabling implementation of a machine learning algorithm, such as a neural network algorithm, to determine correlations between current characteristics of blocks within a data storage device 104 and one or more future endurance metrics of the respective blocks. Specifically, the endurance prediction system 110 can include a machine learning engine 112, a block information data store 114, and a learned correlation data store 116. Operation of the endurance prediction system 110 is described in more detail below. However, in brief, the machine learning engine 112 may represent a computing device (e.g., including a physical processor) configured with specific computer-executable instructions to implement a neural network algorithm based on data gathered regarding operation of multiple data storage devices 104, in order to determine correlations between measured characteristics of data blocks within the data storage devices 104 at a first time and later endurance metrics of the data blocks. To facilitate these functionalities, the endurance prediction system 110 includes a block information data store 114 to store data gathered regarding operation of the data storage devices 104, as well as a learned correlation data store 116 to store the information generated by implementation of a machine learning algorithm based on the gathered data. The block information data store 114 and learned correlation data store 116 may correspond to any persistent or substantially persistent data storage device, or combination of data storage devices. Illustratively, the block information data store 114 and learned correlation data store 116 may correspond, for example, to a hard disk drive (HDD), solid state hybrid drive (SSHD), solid state drive (SSD) or a database or data storage system. The elements of the endurance prediction system 110 may be implemented within a common computing device, or implemented across multiple computing devices in communication with one another (e.g., via the network 106). For example, the endurance prediction system 110 may implemented partially or wholly by computing devices within a hosted service environment including one or more rapidly provisioned and released computing resources, such as computing, networking and/or storage devices. A hosted computing environment may also be referred to as a cloud computing environment.

Figure 2:
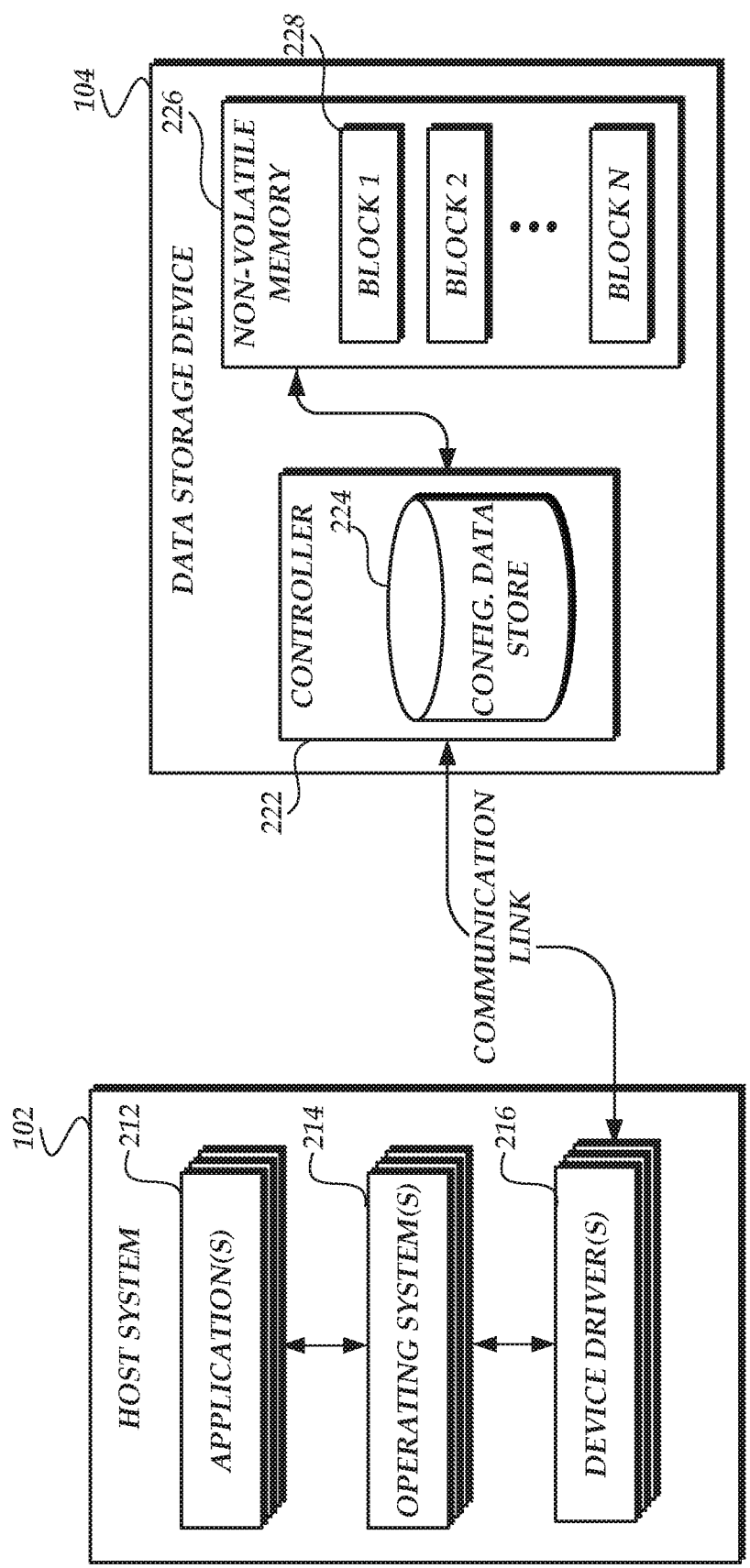
FIG. 2 is a block diagram illustrating a combination of a host system and a data storage device according to some embodiments of the present disclosure.

One example configuration of a host system 102 and data storage device 104 is depicted within FIG. 2. As shown in FIG. 2, the host system 102 generally includes one or more logical applications 212, operating systems 214, and device drivers 216. Such applications 212, operating systems 214, and device drivers 216 can represent logical software modules executed by underlying hardware components of the host system 102 (not shown within FIG. 2). Hardware components of the host system 102 may include, for example, one or more physical processors, application-specific integrated circuits (ASICs), field programmable gate arrays (FPGAs), communication busses, volatile or non-volatile storage media, input devices, or output devices. Components of the host system 102 which enable logical applications 212, operating systems 214, and device drivers 216 are well known to those skilled in the art, and therefore will not be described in more detail herein.

The applications 212 and operating systems 214 may provide various functionalities to users of the host system 110 which require or are assisted by storage of data within the data storage device 104. Accordingly, the host system may include one or more device drivers 216 configured to enable transmission of data storage commands (e.g., read or write commands) to the data storage device 104. Such commands may be transmitted via a communication link between the host system 102 and the data storage device 104. In one embodiment, the communication link may include a storage bus, such as a serial ATA (SATA) storage bus or other storage bus utilizing the advanced host controller interface (AHCI) standard. In another embodiment, the communication link may include a system bus, such as a Peripheral Component Interconnect (PCI) or PCI Express bus. In still other embodiments, the communication link may include network communication links (e.g., Ethernet links enabling communication via transmission control protocol (TCP)/internet protocol (IP) standards), a universal serial bus (USB) link, or any of a variety of known data storage communication links or link that otherwise provides memory access.

The data storage device 104 includes the non-volatile memory 226 coupled to a controller 222. The controller 222 may enable the host system 102 to write to and read from the non-volatile memory 226, and perform other functionalities related to maintenance or operation of the data storage device 104, some of which are described below. The controller 222 may thus include a processor and memory configured to implement these functionalities. Data related to a configuration of the controller 222 may be stored in configuration data store 224, which may correspond illustratively to random access memory (RAM), read only memory (ROM), or a combination thereof. This data may include, for example, operating parameters of the data storage device 104 that designate, for example, how the controller 222 operates to write data to or read data from the non-volatile memory 226.

For example, the non-volatile memory 226 may be a NAND flash memory. The NAND flash memory may include, for example, single-level cell (SLC) memory, multi-tiple-level cell (MLC) memory, or a combination thereof. MLC memory may include 2-bits per cell memory, 3-bits per cell memory (known in some instances as "triple level cell," or TLC, memory), 4-bits per cell memory known in some instances as "quad level cell," or QLC, memory), etc. Cells within the non-volatile memory 226 can be organized into physical or logical groups. In the illustrative example of FIG. 1, the cells are organized into a plurality of blocks 228 (depicted in FIG. 2 as blocks 1 through n). While embodiments of the present disclosure are described with reference to individual blocks, other embodiments may utilize other groupings. For example, embodiments of the present disclosure may predict endurance metrics on a per-page or per-world line basis.

Operation of non-volatile memory 226, such as NAND memory, is known in the art and thus will not be described in detail herein. However, for the purposes of description of embodiments of the present disclosure, one skilled in the art will appreciate that non-volatile memory 226 has measurable characteristics that vary among blocks 228 (e.g., due to variances in manufacturing of the non-volatile memory 226). For example, because memory cells store information in the form of varying levels of voltage, each block 228 can be associated with one or more voltage thresholds that distinguish different information stored by the cell. For example, a stored voltage of between 0.375 and 1.125 volt may indicate a first value (e.g., the bit string 110), a stored voltage of between 1.125 and 1.875 volts may indicate a second value (e.g., the bit string 100), etc. To distinguish between stored values, a storage device 104 may establish one or more read thresholds for a block 228, such that if the stored voltage at the block is below a first threshold, it is determined to store a first value, if the stored voltage at the block is above the first threshold and below a second threshold, it is determined to store a second value, etc. The number of read thresholds established for a cell generally varies with the number of bits storable by the cell. For example, SLC memory generally establishes a single read threshold value, while 2-bit MLC establishes 3 read threshold values, 3-bit MLC establishes 7 read threshold values, 4-bit MLC establishes 15 read threshold values, etc. The controller 222 can be configured to determine optimal read threshold values according to a predetermined algorithm. Various such algorithms for determining optimal read threshold values are known in the art. One example of such an algorithm is described within U.S. Patent Publication No. 2015/0085573 to Sharon et al., entitled "Updating Read Voltages," the entirety of which is incorporated by reference herein. (Note that the term "optimal" as used with respect to "optimal read threshold values" is intended to refer to read thresholds selected according to evaluation metrics of an algorithm for determining such values, as is not intended to imply that such values are in fact optimal under all conditions.)

Other characteristics of blocks 228 can include, for example, times required for the controller 222 to successfully write to a block, a time required to erase a block 228, a number of failed bits detected at a block 228 (e.g., instances in which the controller 222 attempted to write a bit value to a block 228 but after which the controller 222 failed to read that bit value from the block 228), a bit error rate (BER) of a block 228, or a number of programming loops required to set a block 228 to a desired value (e.g., successive applications of voltage to the block 228 to cause the block 228 to maintain a desired voltage level). In accordance with general operation of NAND devices, these characteristics may vary across blocks of non-volatile memory.

As will be appreciated by one skilled in the art, operating parameters of a controller 222 may effect operation of the data storage device 104 in various ways. For example, the number of writes or erasures to a block 228 can effect a BER of the block, the controller 222 may be configured to "wear level" across blocks 228, by distributing writes among the plurality of blocks 228 in an attempt to equalize the number of writes across the plurality of blocks 228. The controller 222 may also be configured to vary how data is written to blocks 228. Illustratively, a controller 222 may be configured to set voltage levels of a cell by multiple relatively small changes in voltage applied to the cell. This process may reduce overall wear on the cell (e.g., reduce future probabilities of failed bits at the cell), but may also require more time to complete. Conversely, a controller 222 may be configured to set voltage levels of a cell by a relatively few, large changes in voltage applied to the cell. This process may complete quickly, but cause relatively high wear on the cell.

Generally, a controller 222 may apply operating parameters across the non-volatile memory 226, such that the controller 222 equalizes writes across blocks 228 or utilizes the same process to write data across blocks 228. However, in accordance with the present disclosure, a controller 222 can be enabled to apply operating parameters per-block 228, according to the expected endurance of an individual block 228. Illustratively, rather than attempting equal wear leveling across blocks 228, the controller 222 may be configured to distribute writes across blocks 228 in a weighted fashion according to an endurance category of the blocks 228. For example, if the controller 222 is notified of two endurance categories (e.g., a high and a low endurance category), the controller 222 can be configured to distribute writes between high and low endurance blocks 228 at a given ratio (e.g., 3 writes to a high endurance block 228 for every 2 writes to a low endurance block 228). Where additional endurance categories are established, ratios may similarly be established between each category. As another illustration of block-level operating parameters, the controller 222 may be configured to utilize more "aggressive" write parameters for blocks 228 of a higher predicted endurance. For example, the controller 222 may utilize higher voltages when writing to blocks 228 of a higher predicted endurance, thus increasing the speed at which data is written to the blocks 228. While utilization of higher voltages may increase wear on the blocks 228, this may be offset by the higher predicted endurance of the blocks 228, and thus have little or no impact on the overall lifespan of the device as compared to a device 104 operating without the use of block-level operating parameters. As yet another illustration of block-level operating parameters, the controller 222 may be configured to implement different garbage collection mechanisms with respect to blocks 228 of high predicted endurance. For example, the controller 222 may implement garbage collection more frequently on blocks 228 of high predicted endurance, improving the speed at which new data can be written to the blocks 228 (due to a reduced need to erase old data on the blocks 228) but increasing wear on the blocks relative to less aggressive garbage collection. Thus, by varying the operating parameters at a per-block level according to the predicted endurance of a block 228, the controller 222 is enabled to increase the speed of operation of the device 104, the longevity of the device 104, or both (e.g., by using a combination of the techniques described above) when compared to a device 104 that operates without block-level operating parameters.

Correlating Characteristics with a Future Endurance Metric

Figure 3:
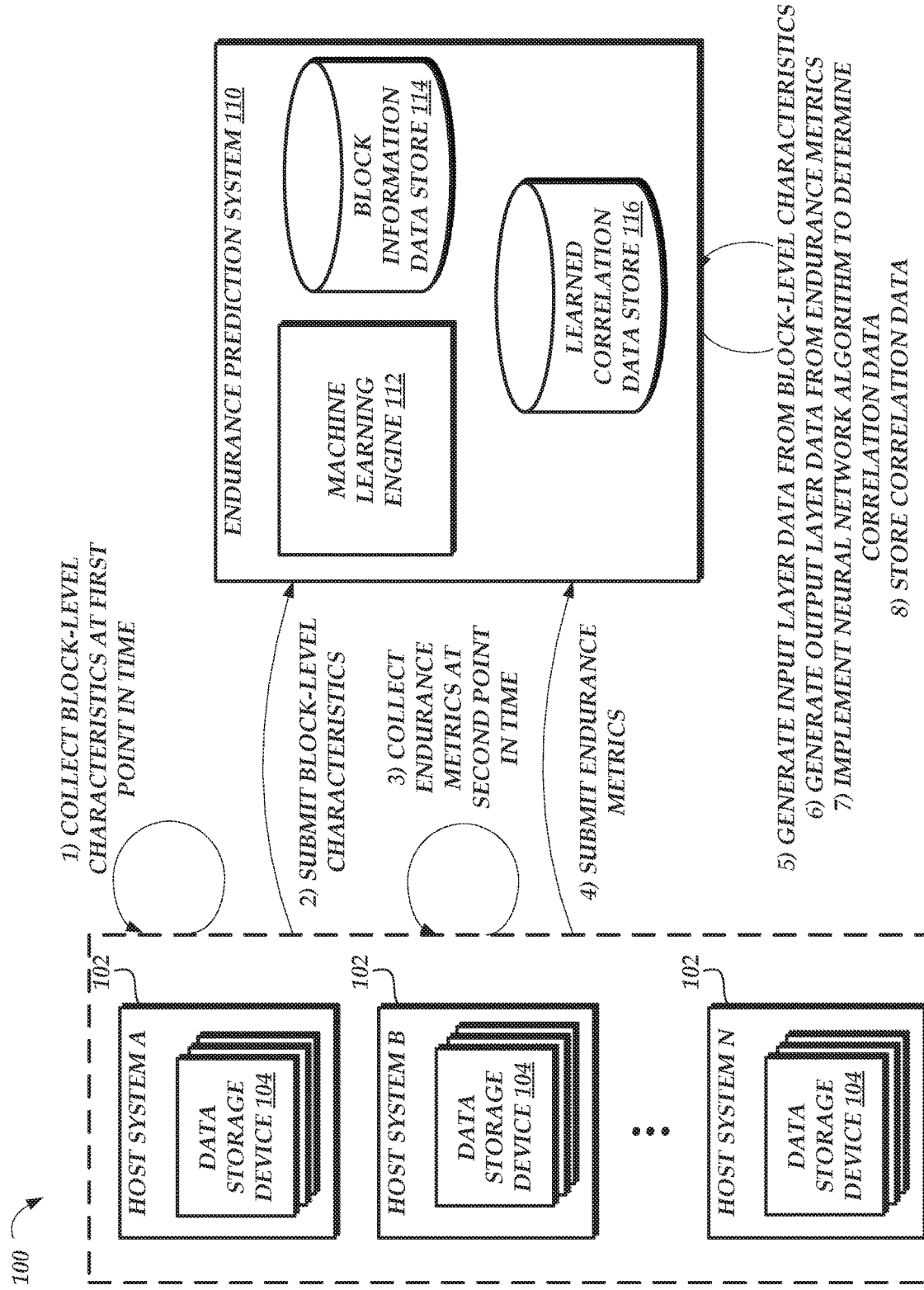
FIG. 3 is a flow-diagram illustrating operation of the endurance prediction system of FIG. 1 to gather to data regarding operation of data storage devices and process that data using a neural network machine learning algorithm.

FIG. 3 is a flow diagram illustrating interactions of various elements of the logical network environment 100 of FIG. 1 in order to determine correlations between measured characteristics of blocks 228 within data storage devices 104 and future endurance metrics of the blocks 228, by application of a machine learning algorithm to data collected regarding the blocks 228 at at least two points in time. The interactions of FIG. 3 begin at (1), where the host systems 102 collect, at a first point in time, information regarding block-level characteristics of data storage devices 104 hosted by the respective host systems 102. The first point in time may be, for example, shortly after manufacture of the devices 104, such as during a quality assurance process for the device 104. Alternatively, the first point in time may be during production use of the device 104. The information regarding block-level characteristics may include, for example, an operational time of a block 228 (e.g., a device 104 including the block 228), temperature information of the block 228 (e.g., including current temperature or historical temperature values), a current number of reads or writes to the block, parameters that have been used to write to the block (e.g., voltage levels applied during writes to the block), a total failed bit count at the block, a bit error rate at the block, a programming time of the block (e.g., a last programming time or an average programming time over a prior period), and erase time of the block (e.g., a last erase time or an average erase time over a prior period), a number of programming loops needed to program the block (e.g., using a standard voltage increment applied across the device 104), or optimal read voltage thresholds determined for the block (e.g., according to a predetermined optimal read voltage threshold algorithm). In one embodiment, the information is collected by a controller 222 within the device 104 and communicated to the host systems 102. In another embodiment, the information is collected by software executing on the host system 102 (e.g., a device driver 216) based on interactions with the controller 222.

At (2), the host systems 102 submit the block-level characteristics to the endurance prediction system 110 (e.g., for storage in the block information data store 114).

Subsequently, the host systems 102, at (3), collect endurance metrics regarding blocks of the devices 104 at a second point in time. The second point in time may correspond, for example, to an end of life of each device 104, which may be defined (for example) by a total operating time of the device 104, a total amount of data written to the device 104, or a number or frequency of uncorrectable bit errors occurring at the device 104. Generally, the second point in time may correspond to any point subsequent to the first point in time, and represent the period over which a future endurance of blocks 228 within the devices 104 should be predicted. Thus, where the first point in time corresponds to just after manufacture of a device 104 and the second point in time corresponds to an end-of-life of the device 104, the interactions of FIG. 3 can function to enable prediction of an end-of-life endurance metric of a block 228 based on block-level characteristics just after manufacture of a device 104. The endurance metrics collected regarding each block 228 can include any metric generally observed or expected to change over the operational life of the block 228. The endurance metrics can include, for example, an operational time of the block 228, a number of writes to a block 228, and number of erasures of the block 228, a number of failed bits detected at the block 228 (a "failed bit count"), a BER (bit error rate) of the block 228, a programming time of the block 228, or an erase time of the block 228, or optimal read voltage thresholds determined for the block 228. Each endurance metric may correspond to an identifier of the block 228 (e.g., a number of block 228 and a serial number of a device 104 including the block 228) such that the endurance metric can be mapped to corresponding block-level characteristics of the block 228 as previously measured.

At (4), the host systems submit the block-level characteristics to the endurance prediction system 110 (e.g., for storage in the block information data store 114).

On or after receiving the block-level characteristic data and the endurance metric information, the endurance prediction system 110 can process the information via a machine learning algorithm in order to determine correlations between characteristics of a block and a future endurance metric of the block. Specifically, at (5), the endurance prediction system 110 (e.g., using the machine learning engine 112) can generate an input layer for a neural network algorithm from the received block-level characteristics. Illustratively, the input layer may include a data vector for each individual block 228 identified within the block-level characteristics. One such data vector may include, for example, optimal read thresholds for the block 228, a failed bit count of the block 228, a programming for the block 228, an erase time for the block 228, and a number of programming loops needed to program the block 228.

At (6), the endurance prediction system 110 can generate an output layer for the neural network algorithm from the endurance metrics received regarding the blocks 228. The output layer may include, for example, a block "class" or "quality level" that corresponds to an endurance metric of the block 228. Illustratively, each block 228 may be logically assigned to a class based on its individual endurance metric as compared to a range of endurance metrics across the blocks 228 within the data set. For example, a top 25% of blocks 228 may be placed in a grade "A" block class, a second 25% of blocks 228 may be placed in a grade "B" block class, etc. The number of block classes may vary across embodiments of the present disclosure according to the data collected and the specific neural network algorithm used by the endurance prediction system 110. For example, an increased number of block classes may enable more granular prediction of block-level endurance, but may require increased computing resources and the endurance prediction system 110 (or on data storage devices 104 that set operating parameters for blocks based on an assigned block class). A lower number of block classes may provide less granular prediction of block-level endurance. In an illustrative embodiment, the number of block classes is four.

At (7), the endurance prediction system 110 implements a neural network algorithm with respect to the generated input and output layers, in order to determine one or more "hidden layers" between the input and output layer, which hidden layers represent correlations between values of the input layers and output layers. The hidden layers may be represented, for example, by an equation that utilizes the data points from an input layer and provides a likelihood of those data points result in a given value at the output layer (e.g., a given block class). In one embodiment, the equation representing the hidden layers may be a weighted linear combination of one or more data points from the input layer. As such, from a given input data vector (the data points corresponding to a given block 228 within the input layer), the equation indicates a strength of correlation to a given output layer value. Thus, by selecting an output layer value most strongly correlated to a given input data vector (e.g., the output layer value with a highest "score" given an input data vector and the determined hidden layer nodes), the endurance prediction system 110 can predict a block class of a block 228 (representing a predicted future endurance metric of the block 228) from block-level characteristics of the block 228. The data produced by implementation of the neural network algorithm is generally referred to herein as a type of "correlation data" that can be generated by a machine learning algorithm. One skill in the art will appreciate that other types of machine learning algorithm (which types are generally known in the art) may produce other types of correlation data, each of which can indicate a likelihood that a block 228 with a given set of characteristics will be associated with a given block class (e.g., a range of a potential endurance metric or multiple endurance metrics) at a future point in time.

At (8), the endurance prediction system 110 stores the learned correlation data (e.g., within the learned correlation data store 116) for future use. As will be discussed below, the learned correlation data may be used to predict a future endurance of individual blocks 228 of a data storage device 104, thus enabling generation of block-level operating parameters.

Generating Block-Level Operating Parameters Using Predicted Block Endurance

Figure 4:
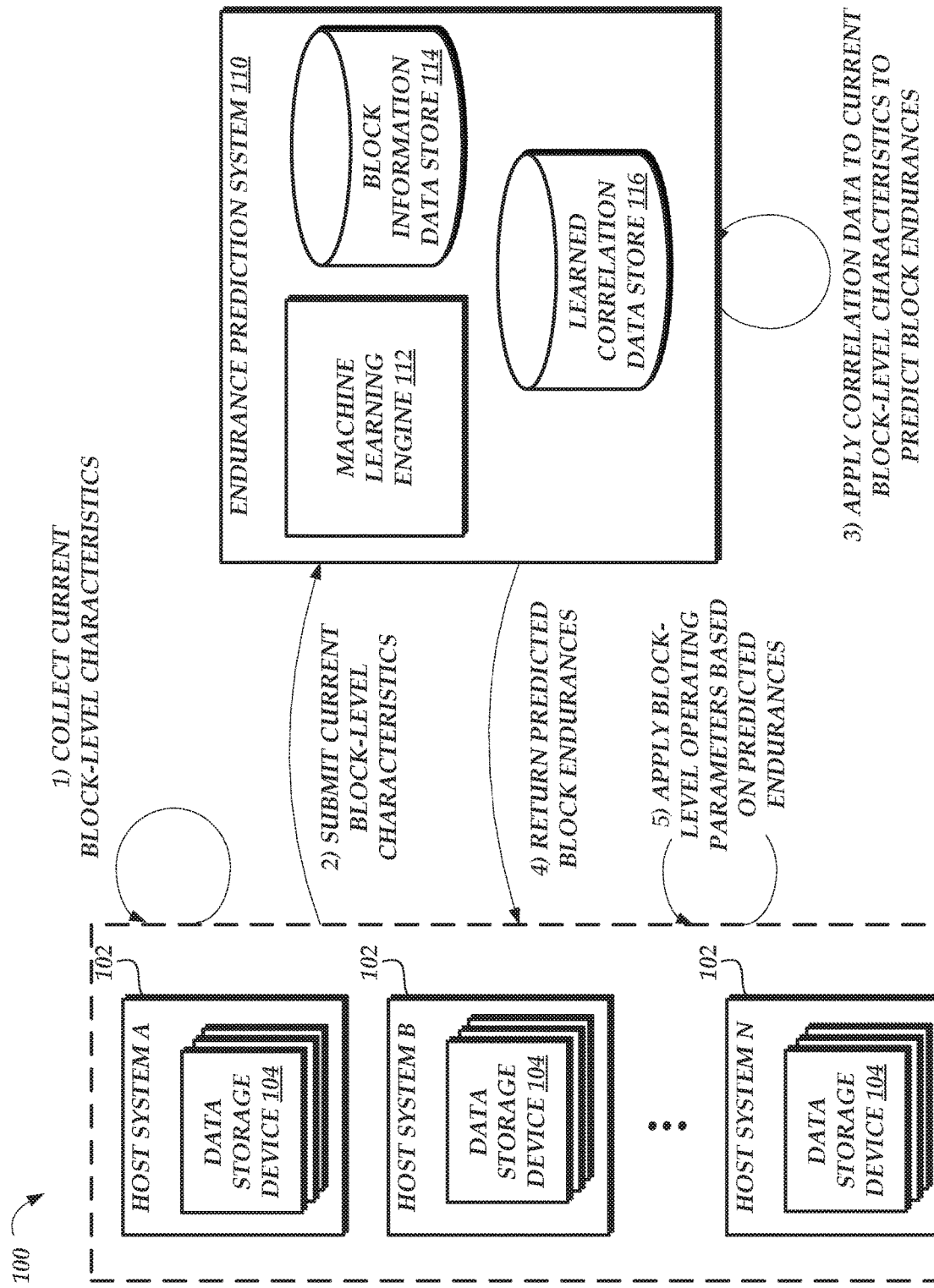
FIG. 4 is a flow-diagram illustrating operation of the endurance prediction system of FIG. 1 to gather to data regarding characteristics of blocks within a data storage device and to predict an endurance of such blocks based on the characteristics and further based on information obtained by application of a neural network machine learning algorithm, and to modify operation of the data storage device according to the predicted endurance of individual blocks within the device.

FIG. 4 is a flow diagram illustrating interactions of various elements of the logical network environment 100 of FIG. 1 in order to generate block-level operating parameters using predict block endurance, based on learned correlations between current block-level characteristics and future block endurance metrics. The interactions of FIG. 4 begin at (1), where the host systems 102 collect block level characteristics regarding data storage devices 104 of the respective host systems 102. As described above with respect to FIG. 3, the block-level characteristics may include, for example, a current number of reads or writes to the block, parameters that have been used to write to the block (e.g., voltage levels applied during writes to the block), a total failed bit count at the block, a bit error rate at the block, a programming time of the block (e.g., a last programming time or an average programming time over a prior period), and erase time of the block (e.g., a last erase time or an average erase time over a prior period), a number of programming loops needed to program the block (e.g., using a standard voltage increment applied across the device 104), or optimal read voltage thresholds determined for the block (e.g., according to a predetermined optimal read voltage threshold algorithm). The block-level characteristics may be collected by a controller 222 within the device 104 and communicated to the host systems 102, or collected by software executing on the host system 102 (e.g., a device driver 216) based on interactions with the controller 222. While the illustrative interactions of FIG. 4 depict collection of block-level characteristics by multiple host systems 102 hosting multiple data storage devices 104, similar interactions may occur with respect to a single host system 102 and a single data storage device 104.

At (2), the host systems 102 submit the block-level characteristics to the endurance prediction system 110 (e.g., for storage in the block information data store 114).

Subsequently, the endurance prediction system 110, at (3), applies learned correlations (e.g., as stored within the learned correlation data store 116) to the retrieved block-level characteristics to predict an endurance of each block 228 (e.g., as represented by an endurance class). Illustratively, for a given block, the endurance prediction system 110 may apply equations corresponding to the learned correlations (e.g., a weighted linear combination of potential block-level characteristics) to the block-level characteristics of a given block 228 to predict a likelihood that the block 228 falls into one of a number of potential block classes. Thereafter, the endurance prediction system 110 can assign a block class to the block 228 corresponding to a most likely block class (e.g., a block class assigned the highest likelihood based on the learned correlations and the characteristics of the block). Thus, the endurance prediction system 110 can determine block class for each block 228 predictive of a future endurance metric of the block 228. At (4), the endurance prediction system 110 can return the predicted block endurances to the host systems 102, which may be stored for use by a controller 222 of the data storage device 104 including the relevant blocks 228.

Thereafter, at (5), the data storage devices 104 (e.g., a controller 222 within each device 104) can apply block-level operating parameters for the device 104 using the predicted endurance metric of each block 228 within the device 104. In one embodiment, a set of predetermined operating parameters may be established by an operator of the endurance prediction system 110 according to a determined block class, and loaded within a memory of the device 104 (e.g., the configuration data store 224). For example, predetermined operating parameters may specify a frequency of writes to a block class relative to other block classes, or may specify write parameters (e.g., voltage increments) to be used for a specific block class. In another embodiment, a user of a host system 102 may be enabled to select from multiple potential per-block class operating parameters. For example, a user may be able to select "performance" parameters to increase write speed to high endurance blocks (e.g., of a top tier block class) relative to other blocks, to select "longevity" parameters to distribute additional writes to high endurance blocks relative to other blocks, or to select "balanced" parameters combining aspects of the performance and longevity parameters. Similar modifications to operating parameters may be made with respect to low endurance blocks (e.g., blocks of a lower tier block class). For example, operating parameters may specify that such blocks should receive fewer writes relative to other block classes, or utilize less aggressive aggress write parameters to reduce wear on such blocks. On applying block-level operating parameters for the device 104, the controller 222 may interact with the non-volatile memory 226 of the device according to the applied block-level operating parameters, thus increasing the performance of the device, the longevity of the device, or both, relative to the use of non-block-level operating parameters.

While the interactions of FIG. 4 relate to the use of the endurance prediction system 110 to predict an endurance of blocks 228 within a device 104, embodiments of the present disclosure can additionally or alternatively enable a device 104 (e.g., a controller 222) to predict endurance of blocks 228 during operation of the device 104. For example, the endurance prediction system 110 may transmit to each device 104 (e.g., during or after the manufacturing of the device 104) learned correlation data (e.g., as stored within the learned correlation data store 116). Each device 104 may be configured to determine current block-level characteristics for the device 104, and apply to learned correlation data to those block-level characteristics to predict an endurance of each block 228 within the device 104. The device 104 may then apply block-level operating parameters, as described above, to modify operation of the device 104 based on the predicted block endurances. Furthermore, this functionality may be repeated multiple times over the life of a device 104 (e.g., at predetermined intervals) to re-determine block-level operating parameters. In this manner, a device 104 is enabled to dynamically determine block-level operating parameters without requiring communication with the endurance prediction system 110.

Routine for Correlating Block Characteristics with an Endurance Metric

Figure 5:
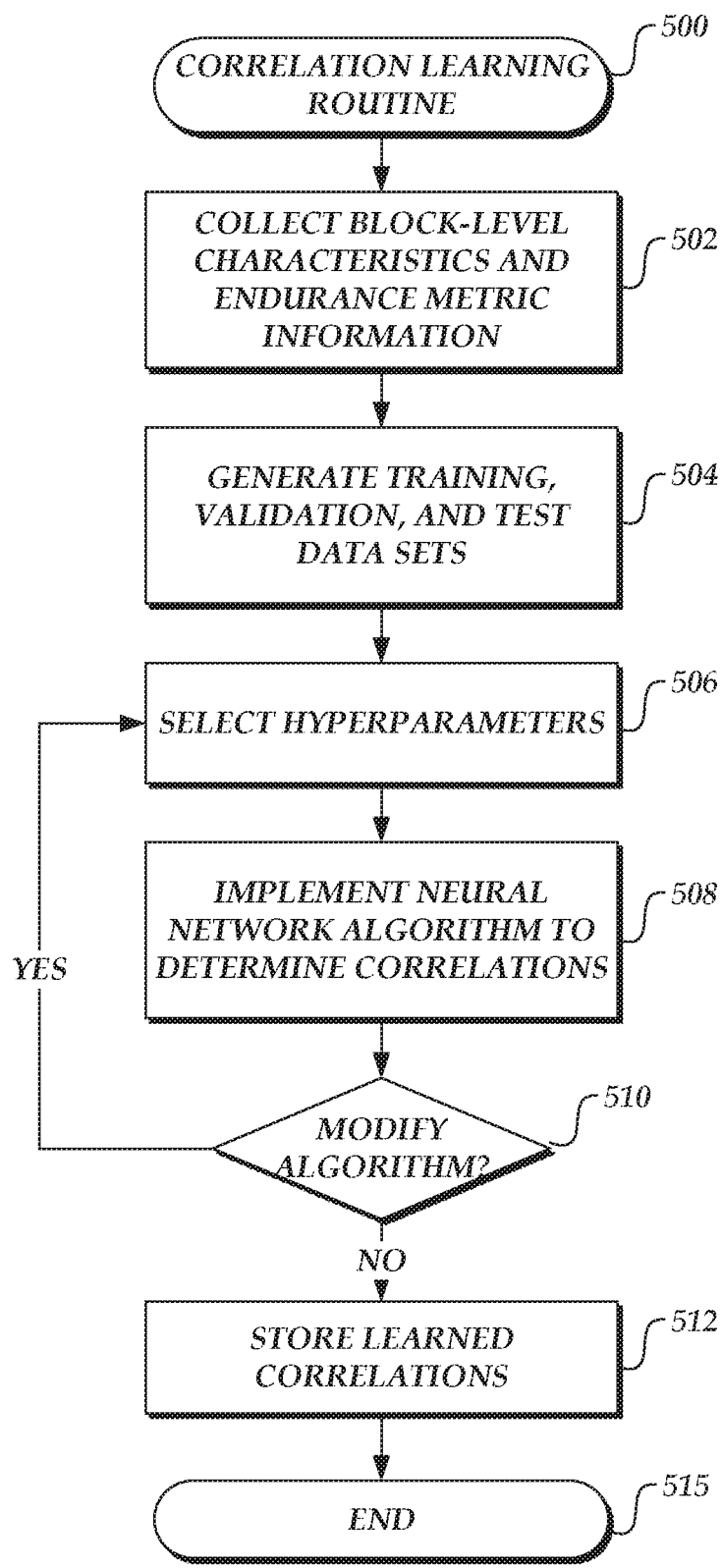
FIG. 5 is an illustrative routine for applying a neural network machine learning algorithm to data regarding operation of data storage devices to determine correlations between characteristics of individual blocks within a storage device and endurance of the individual blocks.

FIG. 5 depicts an illustrative routine 500 for correlating block characteristics of blocks in a data storage device with one or more endurance metrics for such blocks, based on a neural network machine learning algorithm. The routine 500 may be implemented, for example, by the endurance prediction system 110 of FIG. 1.

The routine 500 begins at element 502, wherein the endurance prediction system 110 receives information regarding block-level characteristics of blocks within a set of data storage devices 104. As noted above, block-level characteristics can include any information related to underlying physical characteristics of the device (e.g., which varies across blocks 228 due to variances within a manufacturing process). Block level characteristics can include, for example, an operational time of a block 228 (e.g., a device 104 including the block 228), temperature information of the block 228 (e.g., including current temperature or historical temperature values), a current number of reads or writes to the block, parameters that have been used to write to the block (e.g., voltage levels applied during writes to the block), a total failed bit count at the block, a bit error rate at the block, a programming time of the block (e.g., a last programming time or an average programming time over a prior period), and erase time of the block (e.g., a last erase time or an average erase time over a prior period), a number of programming loops needed to program the block (e.g., using a standard voltage increment applied across the device 104), or optimal read voltage thresholds determined for the block (e.g., according to a predetermined optimal read voltage threshold algorithm). At element 502, the endurance prediction system 110 further receives information identifying one or more endurance metrics for each block 228 associated with block-level characteristics, as determined at a point in time subsequent to collection of the block-level characteristics (e.g., at an end-of-life of a device 104). The endurance metrics collected regarding each block 228 can include any metric generally observed or expected to change over the operational life of the block 228. The endurance metrics can include, for example, an operational time of the block 228, a number of writes to a block 228, and number of erasures of the block 228, a number of failed bits detected at the block 228 (a "failed bit count"), a BER of the block 228, a programming time of the block 228, an erase time of the block 228, or optimal read voltage thresholds determined for the block 228. Each endurance metric may correspond to an identifier of the block 228 (e.g., a number of block 228 and a serial number of a device 104 including the block 228) such that the endurance metric can be mapped to corresponding block-level characteristics of the block 228 as previously measured.

Thereafter, at element 504, the endurance prediction system 110 can generate data sets from the obtained information for use within a neural network machine learning algorithm. The data sets can include, for example, a training data set from which to train a neural network, a validation data set with which to validate the network during training (e.g., to avoid overfitting of the network to the training data), and a test data set to determine an error metric of the neural network (e.g., an accuracy of the learned correlations against data other than that used to train the neural network). Various methods are known within the art for generation of training, validation, and test data sets from a total data set.

At element 506, the endurance prediction system 110 (e.g., via a human operator) can select one or more hyperparameters for use in training the neural network. As used herein, hyperparameters refers to variables related to a structure of a learned neural network, or related to how an algorithm forms a neural network from a set of training data. Various examples of hyperparameters are known in the art, and include (for example), a learning rate of the neural network, a loss function, a number of training iterations to be used when training a network, or a number of units within one or more hidden layers. The values of various hyperparameter may significantly alter the correlation information learned by an neural network algorithm.

Thereafter, at element 508, the endurance prediction system 110 implements the neural network algorithm with respect to the generated data sets, according to the established hyperparameters. Specifically, the endurance prediction system 110 may generate an input layer from the block-level characteristic information and an output layer from the block-level endurance metric information. The endurance prediction system 110 may then implement the neural network algorithm in order to determine, from a training and validation data set, a correlation between given values for block-level characteristics and a given output layer value, such as a block endurance class. Implementation of the neural network algorithm may further include applying the learned correlation information to a test data set from the input data, to determine an error rate of the learned correlations.

At element 510, the endurance prediction system 110 determines whether parameters of the neural network algorithm should be modified based on the learned correlation data and the determined error rate. For example, if the determined error rate is above a threshold value, the endurance prediction system 110 may determine that hyperparameters of the neural network algorithm should be modified. Thus, the routine 500 can return to element 506, where a new set of hyperparameters are determined and the neural network algorithm is once again implemented at element 508. In one instance, elements 510 and 506 may be implemented by a human operator of the endurance prediction system 110. In another instance, elements 510 and 506 may be implemented wholly or partially automatically. For example, the endurance prediction system 110 may be configured to repeatedly modify hyperparameters (e.g., by predetermined increments or randomization) until learned correlation information with a minimum error rate (e.g., as compared to learned correlation information under alternative hyperparameters) is identified.

Thereafter, the routine 500 proceeds to element 512, where the endurance prediction system 110 stores the learned correlation information 512 for later use (e.g., within a learned correlation data store 116). The routine 500 then ends at element 514.

Routine for Generating Block-Level Operating Parameters

Figure 6:
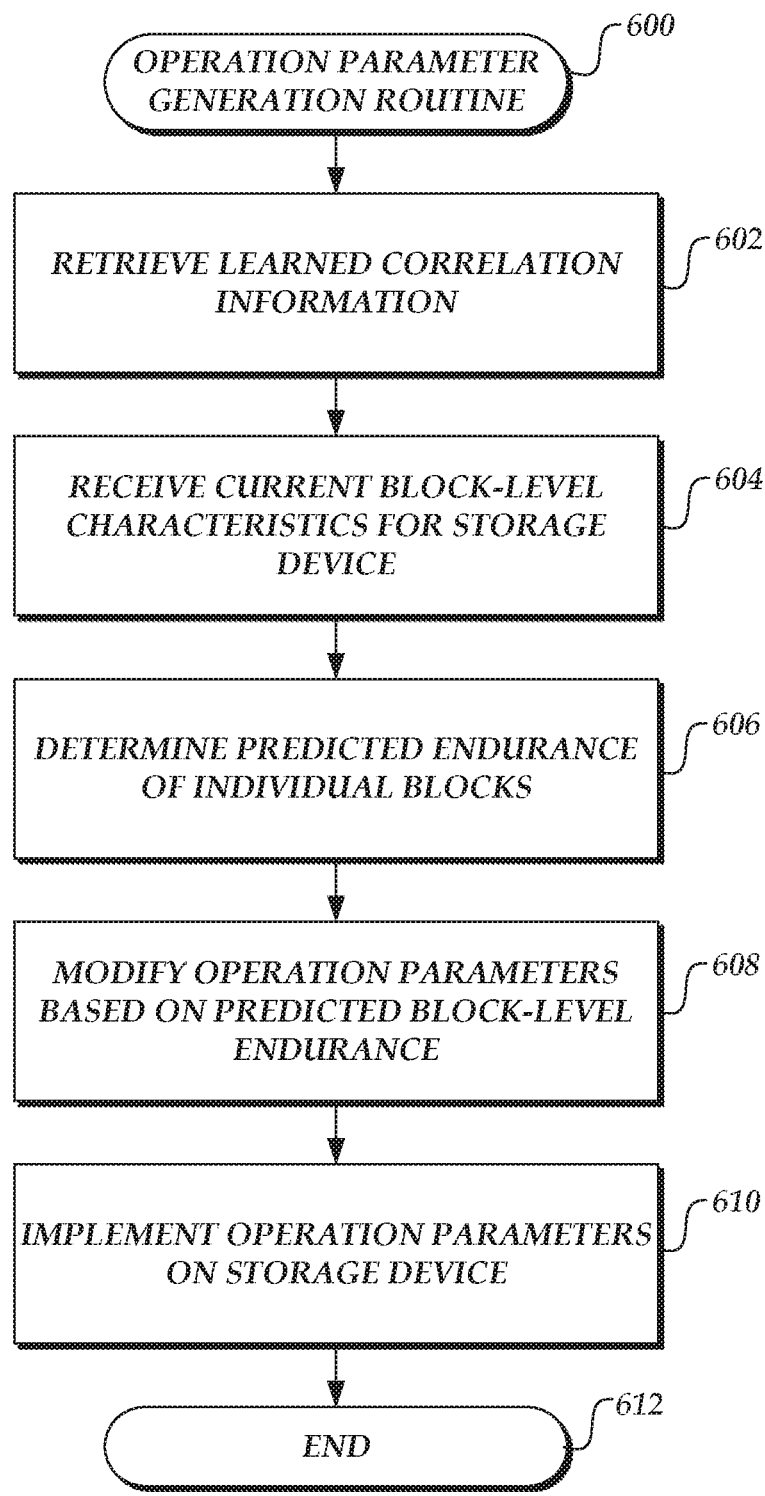
FIG. 6 is an illustrative routine for generating block-level operating parameters for a storage device based on a predicted endurance of individual blocks of the storage device, as determined from learned correlations between characteristics of individual blocks within a storage device and endurance of the individual blocks.

FIG. 6 depicts an illustrative routine 600 for generating block-level operating parameters based on a predicted endurance of blocks 228 within a data storage device 104, as determined from correlation information generated by a machine learning algorithm. The routine 600 may be implemented, for example, by a controller 222 of a data storage device 104, as depicted in FIG. 2.

The routine 600 begins at element 602, wherein the controller 222 retrieves learned correlation information, as generated based on application of a machine learning to historical information regarding operation of other devices 104 (e.g., as described above with reference to FIG. 5). The learned correlation information may be provided to the controller 222, for example, by a host system 102 (e.g., during operation of the device 104) or during manufacture of the device 104.

At element 604, the controller 222 receives current block-level characteristics for the data storage device 104. The received block-level characteristics may correspond to any one or more of the block-level characteristics described above and used to generate the learned correlation information, and may be received by the controller 222 via interaction with the non-volatile memory 226.

Thereafter, controller 222, at element 606, uses the current block-level characteristics and the learned correlation information to predict an endurance of individual blocks 228 within the device 104. For example, the learned correlation information may be applied to characteristics of each block to determine likelihoods that a block 228 falls into each of a number of predetermined block classes, representing a range of a predicted endurance metric for the block 228 at a later point time (such as end-of-life). Thus, the controller 222 can apply the learned correlation information to the characteristics of a block 228, and assign to the block 228 a block class with a highest likelihood predicted from the learned correlation data.

At element 608, the controller 222 uses the determined block classes to modify operating parameters for the device 104 on a per-block basis. As noted above, operating parameters may in some instances be pre-specified for a given block class. Such pre-specified parameters may specify a frequency of writes to a block class relative to other block classes, or may specify write parameters (e.g., voltage increments) to be used for a specific block class. In another embodiment, a user of a host system 102 may be enabled to select from multiple potential per-block class operating parameters. For example, a user may be able to select "performance" parameters to increase write speed to high endurance blocks (e.g., of a top tier block class) relative to other blocks, to select "longevity" parameters to distribute additional writes to high endurance blocks relative to other blocks, or to select "balanced" parameters combining aspects of the performance and longevity parameters. Similar modifications to operating parameters may be made with respect to low endurance blocks (e.g., blocks of a lower tier block class). For example, operating parameters may specify that such blocks should receive fewer writes relative to other block classes, or utilize less aggress write parameters to reduce wear on such blocks. Thus, the controller 222 may receive a selection from a user of a host system 102 and apply such selection when determining operating parameters for individual blocks 228, based on determined block classes.

At element 610, the controller 222 can implement the modified operating parameters to control interaction with the data storage device 104. For example, the controller 222 may use the modified operating parameters to select how to balance writes across blocks 228 of different classes, to select voltages to use in writing data to blocks 228 of different classes, to determine how garbage collection should be implemented on blocks 228 of different classes, etc. By implementation of operating parameters selected according to predicted block endurances, operation of the data storage device 104 can thus be improved with respect to speed, efficiency, or a combination thereof.

CONCLUSION

As discussed above, the present disclosure enables a future endurance metric for an individual block of a flash memory device to be predicted based on current characteristics of the block, reflective of underlying variances in physical attributes of a block due to manufacturing processes. Specifically, the present disclosure describes the application of a machine learning algorithm, such as a neural network algorithm, to historical information regarding blocks of flash memory devices at different points of operation, to generate learned correlation information between characteristics of the block at a first time and an endurance metric at a second time. By applying this learned correlation information to present characteristics of blocks within a storage device, future endurance metrics of the blocks can be predicted. These future endurance metrics can then be used to establish block-level operating parameters for the device, such that increased endurance of individual blocks relative to other blocks can be used to increase the speed to the device, to increase longevity of the device, or both. Thus, embodiments described herein can enable significant improvement in the operation of flash memory devices.

Other Variations

Those skilled in the art will appreciate that in some embodiments, additional or alternative modules can be used to perform functionalities described herein. The actual steps taken in the disclosed processes, such as the routines illustrated in FIGS. 5 and 6, may differ from those shown in the figures. Additional system components can be utilized, and disclosed system components can be combined or omitted. Depending on the embodiment, certain of the steps described above may be removed, others may be added. Furthermore, functionalities described herein may be implemented by additional or alternative components than those to which the functionalities are prescribed above. For example, in some embodiments, functionalities of the endurance prediction system may be implemented within a host system 102 of FIG. 1, or within a controller 222 of FIG. 2. In one embodiment, a host system 102 or controller 222 may implement these functionalities with respect to data pertaining to operation of local devices 104 (e.g., data storage devices 104 under control of a given host system 102 or controller 222). In another embodiment, each of a number of host systems 102 or controllers 222 may be configured with communication software enabling communication of data regarding operation of data storage devices 104 between the devices 104 (e.g., by using peer-to-peer communications software, communicating the data to a centralized network data store, etc.), and thus a host system 102 or controller 222 may implement these functionalities with respect to data pertaining to operation of a number of different devices 104. One of skill in the art will therefore appreciate that a number of different configurations may implement aspects of this disclosure.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to flash memory as included in any number of devices, such as removable flash cards, SSDs, hybrid hard drives, and the like. The various components illustrated in the figures may be implemented as software and/or firmware on a processor, ASIC/FPGA, or dedicated hardware. Hardware components, such as processors, ASICs, FPGAs, and the like, can have logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

While the description herein refers to flash or NAND memory, it is understood that the various disclosed embodiments are applicable to various types of non-volatile solid-state memory which may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete Non-Volatile Memory (NVM) chips, or any combination thereof.

What is claimed is:

1. A computer-implemented method comprising:
    obtaining data regarding operation of data blocks across a plurality of memory devices, each data block including a plurality of memory cells, the data comprising, for each data block:
        a set of characteristics of the data block at a first point in time, wherein the set of characteristics includes at least one of a number of reads of the data block, a number of writes to the data block, and a number of programming loops used to program the data block; and
        an endurance metric of the data block at a second point in time subsequent to the first point in time;
    applying a machine learning algorithm to the data to determine correlation information relating the set of characteristics of each data block at the first point in time with the endurance metric of each data block at the second point in time;
    receiving an additional set of characteristics of a data block of an additional memory device;
    applying the correlation information to the additional set of characteristics to predict a future endurance metric of the data block of the additional memory device; and
    notifying the additional memory device of the predicted endurance metric of the data block.

2. The computer-implemented method of claim 1, wherein the machine learning algorithm is a neural network algorithm.

3. The computer-implemented method of claim 2, wherein applying the machine learning algorithm to the data comprises:
    generating an input data layer from the data, the input data layer including, for each block of the data blocks, the set of characteristics of the data block at the first point in time; and
    generating an output data layer from the data, the output data layer including, for each block of the data blocks, a block classification corresponding to the endurance metric of the block at the second point in time.

4. The computer-implemented method of claim 1, wherein the memory cells are NAND memory cells.

5. The computer-implemented method of claim 1, wherein the predicted endurance metric of the data block is represented as a classification for the data block.

6. The computer-implemented method of claim 1 further comprising:
    subsequent to a time at which the additional set of characteristics were received, receiving an endurance metric of the data block of the additional memory device;
    updating the data to include the additional set of characteristics and the endurance metric of the data block of the additional memory device; and
    applying the machine learning algorithm to the updated data to determine updated correlation information.

7. The computer-implemented method of claim 1, wherein the endurance metric includes at least one of a total failed bit count of the individual data block, a bit error rate of the individual data block, a programming time of the individual data block, or read voltage thresholds determined for the individual data block.

8. A memory device comprising:
    non-volatile memory comprising a plurality of data blocks, each data block including a plurality of memory cells; and
    a controller comprising a processor and configured to:
        obtain correlation information relating one or more characteristics of each data block at a first point in time with a predicted endurance metric of each data block at a second point in time, wherein the correlation information is generated by application of a machine learning algorithm to historical data regarding operation of a plurality of additional memory devices at at least two points in time;
        for each data block of the plurality of data blocks:
            determine a set of characteristics of the data block, wherein the set of characteristics includes at least one of a number of reads of the data block, a number of writes to the data block, and a number of programming loops used to program the data block, and read voltage thresholds determined for the data block;
            apply the correlation information to the set of characteristics to predict a future endurance metric of the data block; and
            modify operating parameters of the memory device with respect to the data block based at least partly on the predicted future endurance metric of the data block.

9. The memory device of claim 8, wherein the controller is further configured to modify the operating parameters of the memory device with respect to an individual data block by modifying a frequency of writes to the individual data block relative to other data blocks of the non-volatile memory, and wherein the frequency is based at least partly on the predicted future endurance metric of the individual data block.

10. The memory device of claim 8, wherein the controller is further configured to modify the operating parameters of the memory device with respect to an individual data block by modifying a voltage level used to write to the individual data block, and wherein the voltage level is based at least partly on the predicted future endurance metric of the individual data block.

11. The memory device of claim 8, wherein the controller is further configured to modify the operating parameters of the memory device with respect to an individual data block by modifying garbage collection parameters relating to removal of unneeded data from the individual data block, and wherein the garbage collection parameters are based at least partly on the predicted future endurance metric of the individual data block.

12. The memory device of claim 8, wherein the controller is further configured to, at a second point in time:
for each data block of the plurality of data blocks:
determine a second set of characteristics of the data block at the second point in time;
apply the correlation information to the second set of characteristics to determine a second predicted future endurance metric of the data block; and
modify operating parameters of the memory device with respect to the data block based at least partly on the second predicted future endurance metric of the data block.

13. The memory device of claim 8, wherein the controller is further configured to submit the determined set of characteristics of each data block to a remote machine learning system.

14. The memory device of claim 8, wherein the controller is further configured to update the correlation information by retrieving updated correlation information from a remote machine learning system.

15. A system for predicting endurance of non-volatile solid-state memory cells within a memory device, the system comprising:
non-transitory computer memory storing data regarding operation of data blocks across a plurality of memory devices, each data block including a plurality of non-volatile solid-state memory cells, the data comprising, for each data block:
a set of characteristics of the data block at a first point in time, wherein the set of characteristics includes at least one of a number of reads of the data block, a number of writes to the data block, and a number of programming loops used to program the data block; and
an endurance metric of the data block at a second point in time subsequent to the first point in time;
a computing device including a processor configured with computer-executable instructions, which when executed by the processor, cause the processor to:
apply a machine learning algorithm to the data to determine correlation information relating the set of characteristics of each data block at the first point in time with the endurance metric of each data block at the second point in time;
receive an additional set of characteristics of a data block of an additional memory device;
apply the correlation information to the additional set of characteristics to predict a block classification of the data block of the additional memory device; and
notify the additional memory device of the predicted block classification, the predicted block classification being usable by the additional memory device to modify operating parameters of the additional memory device based at least partly on the predicted block classification of the data block.

16. The system of claim 15, wherein at least one of the first point in time or the second point in time is set according to a total operating time of an individual memory device, a number of writes to the individual memory device, a number of erasures of data from the individual memory device, a number of failed bits detected on the individual memory device, or a bit error rate on the individual memory device, or a number of uncorrectable errors occurring on the individual memory device.

17. The system of claim 15, wherein the correlation information includes an equation relating potential values of characteristics within the set of characteristics to a predicted value of the endurance metric.

18. The system of claim 17, wherein the equation is a weighted linear equation.

19. The system of claim 15, wherein the number of programming loops used to program the data block indicates a number of successive applications of voltage to the data block to cause the data block to maintain a desired voltage level.

20. The system of claim 15 further comprising the additional memory device, wherein the additional memory device includes a controller configured to:
determine the additional set of characteristics of the data block of the additional memory device;
transmit the additional set of characteristics to the computing device;
receive a notification of the predicted block classification; and
modify operating parameters of the additional memory device based at least partly on the predicted block classification of the data block.

21. A system for improving storage device endurance of a memory device based on predicted endurance of non-volatile solid-state memory cells within the memory device, the system comprising:
non-transitory computer memory storing data regarding operation of data blocks across a plurality of memory devices, each data block including a plurality of non-volatile solid-state memory cells, the data comprising, for each data block:
a set of characteristics of the data block at a first point in time, wherein the set of characteristics includes at least one of a number of reads of the data block, a number of writes to the data block, and a number of programming loops used to program the data block; and
an endurance metric of the data block at a second point in time subsequent to the first point in time;
a computing device including a processor configured with computer-executable instructions, which, when executed by the processor, cause the processor to:
perform a supervised learning training scheme to train a model for predicting endurance of a plurality of blocks in an additional memory device at least partly by:
generating an input data layer from the data, the input data layer including, for each block of the data blocks, the set of characteristics of the data block at the first point in time;
generating an output data layer from the data, the output data layer including, for each block of the data blocks, a block classification corresponding to the endurance metric of the block at the second point in time; and
applying a neural network algorithm to the input data layer and the output data layer to determine correlation information; and
apply the model to classify a data block of an additional memory device based on the predicted endurance of the data block of the additional memory device at least partly by:
receiving an additional set of characteristics of the data block of the additional memory device;

applying the correlation information to the additional set of characteristics to predict a block classification of the data block of the additional memory device; and notifying the additional memory device of the predicted block classification, wherein the additional memory device is configured to modify operating parameters of the additional memory device based at least partly on the predicted block classification of the data block to improve endurance of the additional memory device.

22. The system of claim 21, wherein the first point in time corresponds to a point in time prior to operational life of respective memory devices of the plurality of memory devices, and wherein the second point in time corresponds to an end of life of the respective memory devices.

23. The system of claim 21, wherein the executable instructions further cause the processor to cause at least one memory device of the plurality of memory devices to reach the second point in time at least partly by performing a plurality of program-erase cycles on the at least one memory device, each program-erase cycle comprising writing of data to the at least one memory device and erasing the data.

24. The system of claim 21, wherein the operating parameters include at least one of a parameter for relocation of data stored within data blocks of the additional memory device, a parameter for allocating the data blocks of the additional memory device to store data, a parameter for garbage collection, a read voltage threshold value, or a parameter for writing data to the data blocks of the additional memory device.

* * * * *